United States Patent
Trihy et al.

(10) Patent No.: US 7,412,370 B2
(45) Date of Patent: Aug. 12, 2008

(54) MODELING LINEAR AND NON-LINEAR SYSTEM RESPONSE TO A PULSE TRAIN

(75) Inventors: Richard Trihy, San Jose, CA (US); Ronald Alan Rohrer, Saratoga, CA (US)

(73) Assignee: Agilent Technologies, Inc., Santa Clara, CA (US)

(*) Notice: Subject to any disclaimer, the term of this patent is extended or adjusted under 35 U.S.C. 154(b) by 360 days.

(21) Appl. No.: 11/007,521

(22) Filed: Dec. 7, 2004

(65) Prior Publication Data

US 2006/0122827 A1 Jun. 8, 2006

(51) Int. Cl.
G06G 7/48 (2006.01)
G06F 17/50 (2006.01)

(52) U.S. Cl. ............................................. 703/14; 703/4

(58) Field of Classification Search .................. 703/4, 703/14
See application file for complete search history.

(56) References Cited

U.S. PATENT DOCUMENTS

| | | | |
|---|---|---|---|
| 6,349,272 B1* | 2/2002 | Phillips ........................ | 703/2 |
| 2003/0046045 A1* | 3/2003 | Pileggi et al. .................. | 703/4 |
| 2004/0071363 A1* | 4/2004 | Kouri et al. .................. | 382/276 |
| 2005/0015242 A1* | 1/2005 | Gracie et al. ................ | 704/211 |

OTHER PUBLICATIONS

S.M. narayana, G.S. Rao, R.S. Adve, and T.K. Sarkar. "Interpolation/Extrapolation of Frequency Domain Responses Using the Hilbert Transform" IEEE, 1995 pp. 335-338.*

Jun Ewi Lu, Sotoshi Yamada, H. Barry Harrison. "Application of harmonic Balance-Finite Element method (HBFEM) in the Design of Switching Power Supplies" 1996 IEEE pp. 347-355.*

Alan V. Oppenheim, Alan S. Wilsky, and S. Hamid Nawab. "Signals and Systems Second Edition" 1997 Prentice Hall, Pearson Eduction. pp. 659-661 and 617-619.*

Alan V. Oppenheim, Ronald W. Schafer, John R. Buck. "Discrete-Time Signal Processing: Second Edition" 1999, Prentice Hall Signal Processing Series. pp. 51-52 and 31.*

Oppenheim, Alan;; Willsky, Alan; Nawab, Hamid; "Signals and Systems" 1997. Prentice Hall.Second Edition. p. 659-661.*

Nuggehally, Jayant; Christensen, Susan; "Effects of Packet Losses in Waveform Coded Speech and Improvements Due to an Odd-Even Sample-Interpolation Procedure." Feb. 1981 IEEE Transactions on Communications, vol. Com-29, No. 2, p. 101-109.*

Oppenheim, Alan; Wilsky, Alan; Nawab, Hamid; "Signals and Systems" 1997. Prentice Hall, Second Edition. p. 682-701.*

Nuggehally, Jayant; Christensen, Susan; "Effects of Packet Losses in Waveform Coded Speech and Improvements Due to an Odd-Even Sample-Interpolation Procedure." Feb. 1982 IEEE Transactions on Communications, vol. Com-29, No. 2, p. 101-109.*

* cited by examiner

*Primary Examiner*—David Vincent
*Assistant Examiner*—Ben M Rifkin

(57) ABSTRACT

The response of linear and non-linear systems to an arbitrary pulse train is modeled for efficient and accurate circuit simulation. First, a harmonic balance analysis is performed for a system incorporating linear and non-linear components. Then, the even and odd frequency components of the harmonic balance result are separated and interpolated. Finally, the resulting interpolated components are combined to generate the frequency domain positive step response and the frequency domain negative step response of the system. These resulting frequency domain step responses are utilized to generate a low order pole/zero model of the step responses. The pole/zero model can then be used to efficiently and accurately model the response of the system to an arbitrary sequence of positive and negative going pulses.

26 Claims, 5 Drawing Sheets

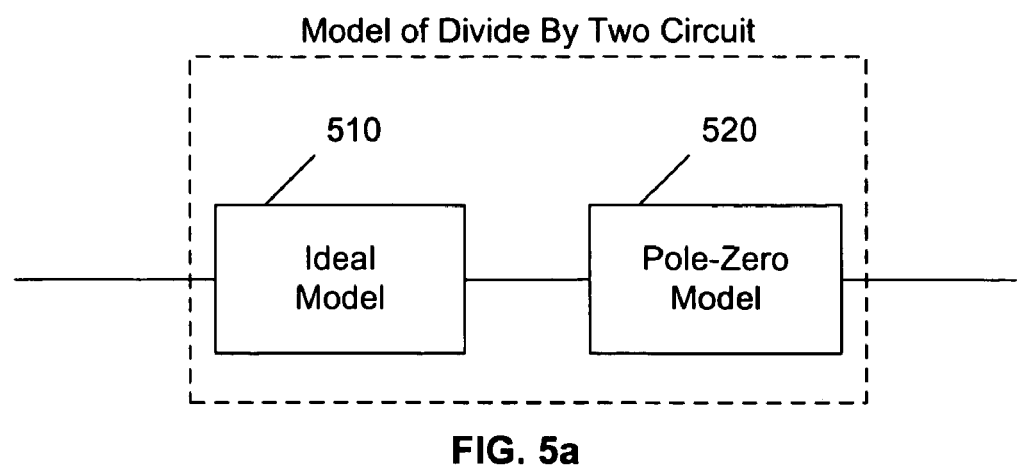
FIG. 5a
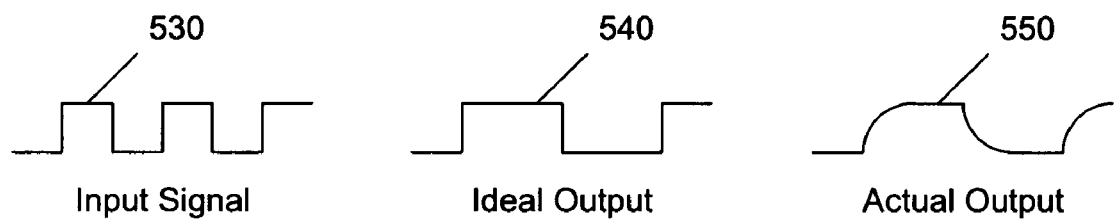
| FIG. 5b | FIG. 5c | FIG. 5d |

MODELING LINEAR AND NON-LINEAR SYSTEM RESPONSE TO A PULSE TRAIN

FIELD OF THE INVENTION

This invention relates to the area of computer aided design of integrated circuits, and more specifically to the use of simulation models in the design of integrated circuits comprising both analog and digital components.

BACKGROUND OF THE INVENTION

The design and verification of integrated circuit designs is becoming increasingly complex. To this end, computer aided design is an integral part of the design cycle of integrated circuits, and the role of accurate and efficient computer aided design is becoming increasingly predominant. Particularly challenging are high frequency integrated circuits incorporating both analog and digital components. The interface between the analog and digital portions of the circuit imposes special challenges since traditional digital simulation techniques and traditional analog simulation techniques are frequently both inadequate to accurately capture circuit behavior in a way that is efficient to simulate.

Certain types of circuits are particularly problematic in this regard, such as those performing the functions of a phase locked loop (PLL) or a serializer/deserializer (SERDES). These circuits present difficulties because they have high frequency signals, but change slowly in response to other inputs. A harmonic balance analysis, which is commonly used to analyze analog circuits, can be prohibitively expensive because the number of harmonics necessary to capture both the high frequency and low frequency behavior would be very large. Alternatively, an accurate time-domain simulation, commonly used in digital circuit analysis, can also be prohibitively expensive. This is because the steps have to be small in order to capture the high frequency components and the number of steps have to be large to capture the overall circuit behavior and the processing of the information-carrying signal. Furthermore, since the analog nature of the signals need to be captured, the amount of computation that must be performed at each time step is significant.

As a result of these shortcomings, circuits bridging analog and digital components are often simulated in a way that lacks accuracy. In particular, the output stages of circuit blocks are approximated based on simplistic assumptions that do not reflect the actual circuit behavior. This can cause integrated circuits to be built with unexpected behavior, leading to time-consuming and expensive re-design. Thus, what is needed is a method of modeling circuit blocks accurately so that efficient time domain simulations can be performed without sacrificing the accuracy of the results.

SUMMARY OF THE INVENTION

A method of generating an accurate and efficient model of the response of a circuit to an arbitrary pulse train is described. The method starts with the generation of the frequency domain response of a system to a periodic waveform. Next the even and odd frequency components are separated and interpolated. The interpolated odd components and interpolated even components are then combined to generate the frequency domain positive step response and the frequency domain negative step responses of the circuit.

In one embodiment, the generation of the frequency domain response utilizes a harmonic balance analysis. The periodic waveform is a square wave in one embodiment. Any of a number of interpolation methods may be used to interpolate the even and odd components. The interpolation of the even and odd components can involve the fitting of a rational polynomial in the Laplace variable s to the known frequency components.

In one aspect of the invention, the frequency domain positive and negative step responses are utilized to generate time domain positive and negative step responses. Alternatively, the frequency domain positive and negative step responses can be utilized to find a low order pole/zero model for the positive and negative step responses.

The invention will be better understood with reference to the drawings and detailed description below.

BRIEF DESCRIPTION OF THE DRAWINGS

FIG. 5a illustrates an application of an embodiment of the invention to a divide by two circuit.

FIG. 5b illustrates an input signal waveform.

FIG. 5c illustrates an ideal output signal waveform.

FIG. 5d illustrates an actual output signal waveform.

DETAILED DESCRIPTION OF THE PREFERRED EMBODIMENT

Figure 1:
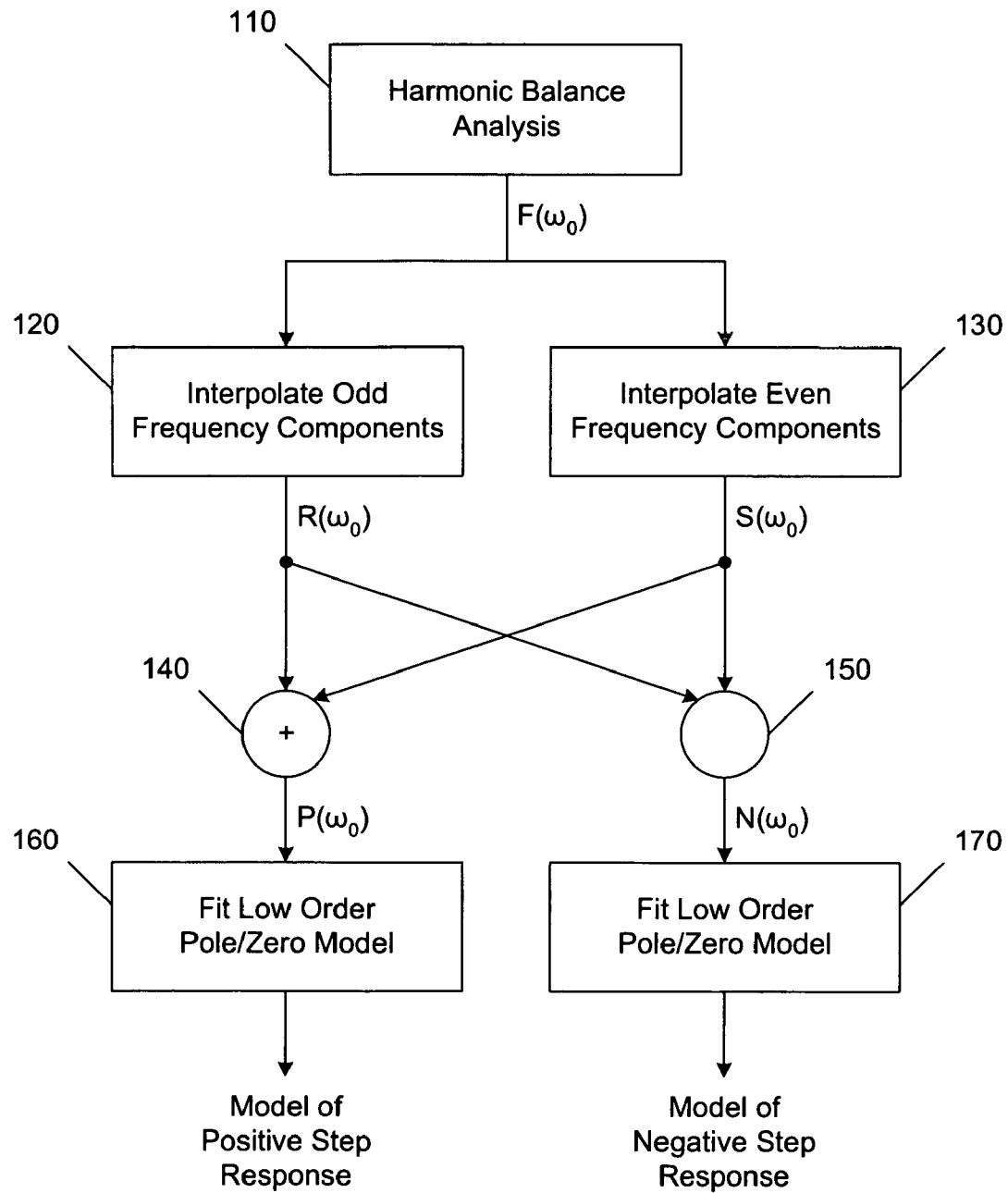
FIG. 1 illustrates the steps performed in an embodiment of the invention.

A method for performing time domain simulations of integrated circuits is described that is both highly accurate and has low computational overhead and is therefore efficient as well. The method is particularly well suited for integrated circuits comprising both analog and digital components, where there is a desire to accurately characterize the interface between the analog and the digital components. In particular, digital signals typically involve the transition of signals between two states (low to high and high to low) while analog signals can be at arbitrary voltages for arbitrary lengths of time.

It is often necessary to characterize the behavior of an analog circuit to an arbitrary digital input, i.e., a pulse train that is not periodic and can constitute arbitrary sequences of high to low or low to high transitions at arbitrary times.

The method described allows the development of accurate pole/zero models of the positive and negative step responses of a circuit containing both linear and non-linear components. The pole/zero models are low order and thus low in computational overhead. These models can consequently be used in fast time domain simulation of the circuit blocks to arbitrary pulse trains. Alternatively, the time domain positive and negative step responses can be generated with the described method. These time domain responses can also be used in an efficient and accurate time domain simulation of the circuit block.

The method described herein starts with the frequency domain response of a system to a periodic waveform. This frequency domain response can be generated from a harmonic balance analysis, which is a well known technique of generating the frequency domain response of a system incorporating both linear and non-linear components. Alternative methods of generating the frequency domain response to a periodic waveform could be used.

Next, the frequency samples of such a frequency domain response are separated into even and odd frequency groups. Each group has known frequency components and unknown frequency components. With an interpolation step, the known frequency components are used to generate the unknown frequency components in each group. Finally, the two groups of interpolated frequency samples are mathematically combined into the frequency domain positive and negative step responses of the system. These frequency domain step responses are then used to develop models for time domain simulation of the system to arbitrary sequences of pulses.

The separation, interpolation and combination steps of the present invention can better be understood with reference to the following mathematical description. First, consider a square wave excitation to be comprised of a sequence of positive and negative transitioning step functions in time. Let the positive step function be p(t) and the negative step function be n(t), with Fourier transforms P(ω) and N(ω), respectively. A square wave with period T is thus composed of the function p(t) added to the function n(t) shifted in time by T/2. In the frequency domain we have:

$$F(\omega) = P(\omega) \cdot \Sigma e^{-jm\omega T} + N(\omega) \cdot e^{-jm\omega T/2} \cdot \Sigma e^{-jm\omega T}$$

where F(ω) is the Fourier transform of the system response to the square wave input. Assuming it were to converge, we evaluate the series $$\Sigma e^{-jm\omega T} = 1/(1 - e^{-j\omega T})$$

Hence we have:

$$F(\omega) = P(\omega) \cdot [1/(1-e^{-j\omega T})] + N(\omega) \cdot e^{-jm\omega T/2} / (1-e^{-j\omega T/2}/(1-e^{-j\omega T})$$

Note that F(ω) is singular (i.e. has poles) at ωT=2πm, or at ω=2πm/T, which are the frequency sampling points in the Harmonic Balance analysis. At these poles, we have the related residues:

$$P(2\pi m/T) + N(2\pi m/T) e^{-jm\omega\pi}$$

Since:

$$e^{-jm\omega\pi} = \cos(\pi m) - j \sin(\pi m) = (-1)^m$$

the residues can be written as:

$$P(2\pi m/T) + (-1)^m N(2\pi m/T)$$

or:

$$P(2\pi m/T) + N(2\pi m/T) \text{ for m even}$$

$$P(2\pi m/T) - N(2\pi m/T) \text{ for m odd}$$

The two preceding equations illustrate that the frequency domain response of a system to a periodic waveform can be mathematically decomposed into a combination of the frequency domain positive and negative step responses of the system. This key observation leads to the following new insight: the Fourier transforms of the positive and negative transitions can be inferred from the frequency domain samples that are the Fourier series coefficients found in periodic steady state analysis. In other words, by intelligently analyzing the frequency response of a system to a periodic square wave, it is possible to extract the positive and negative step responses of that system. This insight allows us to efficiently bridge the gap between periodic steady state analysis and step response, which can be used for arbitrary, non-periodic inputs.

FIG. 1 illustrates an embodiment of a method of generating a model of the positive and negative step response. A square wave of an arbitrary period is input to a linear system and a harmonic balance analysis is performed, represented by step 110. Harmonic balance analysis is commonly used to generate the frequency domain response of a system incorporating both linear and non-linear components. In alternative embodiments, another type of analysis that generates the Fourier transform F(ω) of the output or outputs of the system can be utilized. F(ω) contains the phase and amplitude of the output at the frequency of the square wave, and its harmonics. In practice, a relatively small number of harmonics (e.g. about ten) are generally needed to sufficiently capture the characteristics of the circuit although in alternative embodiments, any number of harmonics could be utilized.

The steps labeled 120 and 130 in FIG. 1 represent the interpolation of odd and even components, respectively. Further detail on the interpolation steps is provided in FIGS. 2a, 2b, 2c, 3a and 3b. The purpose of the interpolation steps is to separate even and odd frequency components and then utilize the known frequency samples of each group to estimate the unknown frequency samples in each group. In particular, we estimate R(ω)=P(ω)+N(ω) by fitting a curve to the even samples and similarly we estimate S(ω)=P(ω)−N(ω) by fitting a different curve to the odd samples. Note that for a purely linear system R(ω)=0, for non zero ω.

Figure 2A:
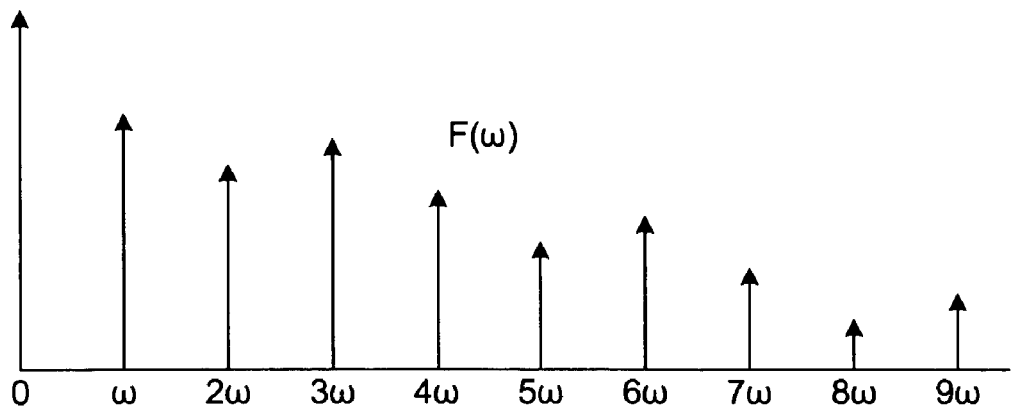
FIG. 2a illustrates the frequency domain representation of an output function with eight harmonics.
Figure 2B:
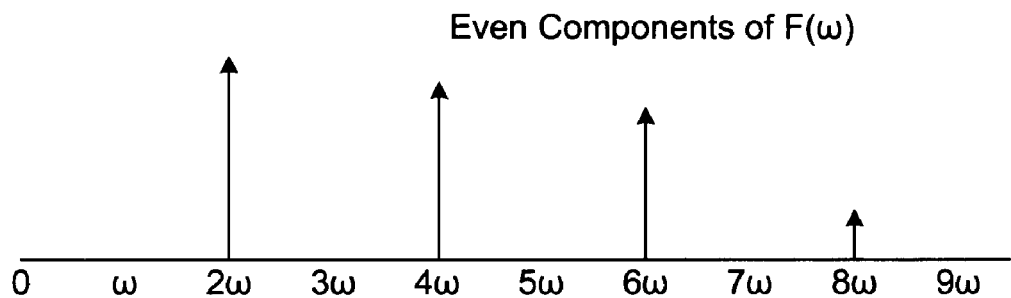
FIG. 2b illustrates the even components of the frequency domain representation of an output function.
Figure 2C:
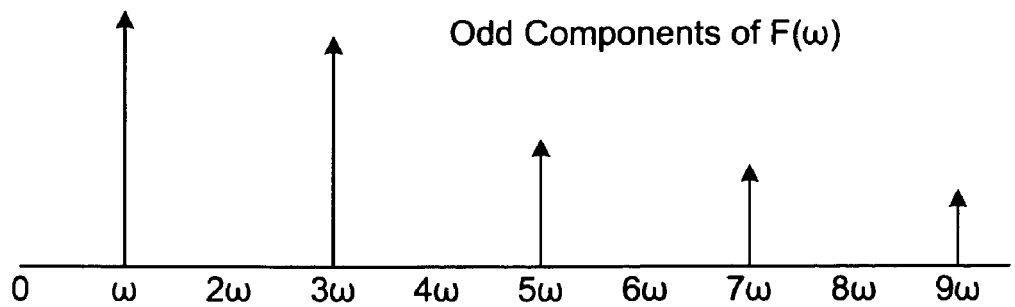
FIG. 2c illustrates the odd components of the frequency domain representation of an output function.
Figure 3A:
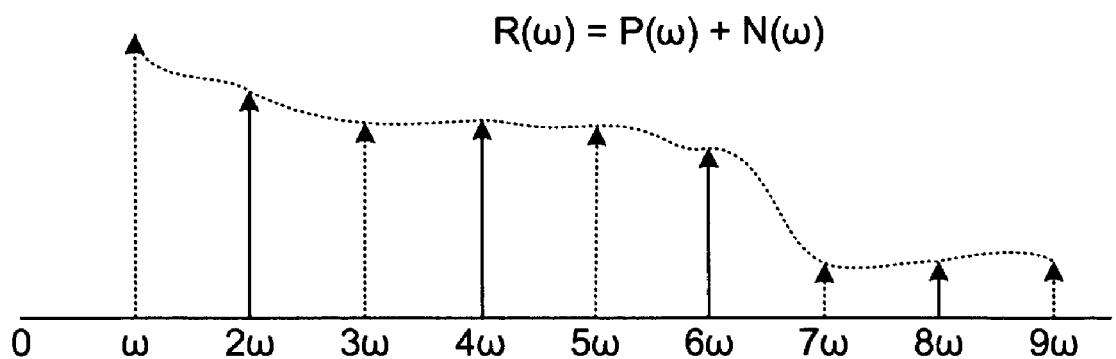
FIG. 3a illustrates the interpolation of the even components of the frequency domain samples illustrated in FIG. 2b.
Figure 3B:
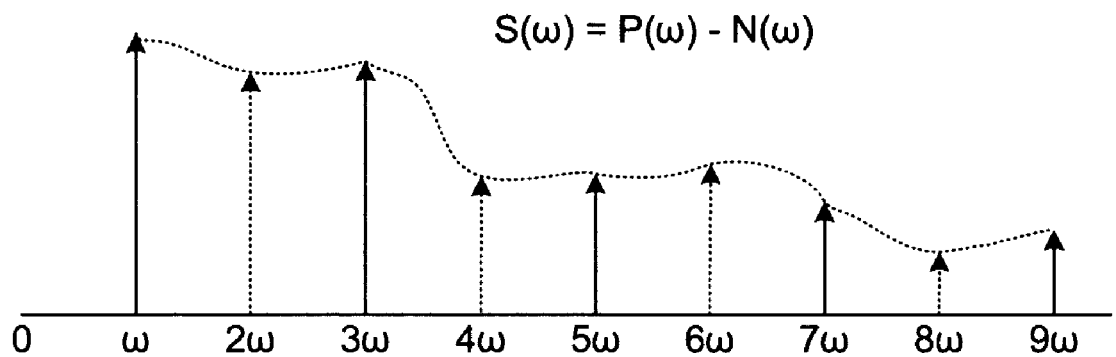
FIG. 3b illustrates the interpolation of the odd components of the frequency domain samples illustrated in FIG. 2c.

FIG. 2a illustrates the frequency space samples that are generated from the response of the system to a periodic excitation. This may be the result of a harmonic balance analysis on the particular circuit being modeled. FIG. 2a illustrates a DC component, the response at the frequency $\omega_0$ and the response at eight harmonics of $\omega_0$. Before the interpolation steps, the even and odd frequency samples are separated into even an odd groups, as illustrated by FIGS. 2b and 2c respectively. Next, curves are fitted to the known frequency components in each group to generate the unknown frequency components in that group. FIG. 3a illustrates how a curve fitted to the even frequency group, illustrated as a dotted line that connects the top of the frequency samples. The unknown frequency components, illustrated as dotted arrows in FIG. 3a, are then generated from this fitted curve. Similarly, FIG. 3b illustrates the fitting of a curve to the odd frequency components to generate the missing frequency samples in the odd group.

There are many different ways in which the interpolation steps can be implemented. In one embodiment, pole/residue type functions are utilized. Rational polynomials in the Laplace variable s are found that fit the known Fourier samples. These polynomials are then utilized to compute the missing Fourier samples. There are a variety of known mechanisms to perform this type of curve fitting. Alternative mechanisms for interpolating the even and odd frequency samples could be used. The frequency sample at ω=0 is the DC component, or the average value of the signal. When interpolating the samples of the even and odd frequency components, the DC component is not used. Instead, a pole at the origin is assumed in the pole/zero fitting algorithm since a step response is expected. The DC component can be used to correct the average or DC component of the p(t) and n(t) curves if they are regenerated.

Once we have these two curves, we can find $P(\omega)$ and $N(\omega)$ using the following two formulas, represented by the functions labeled 140 and 150 respectively in FIG. 1:

$$P(\omega_0) = \tfrac{1}{2}(R(\omega_0) + S(\omega_0))$$

$$N(\omega_0) = \tfrac{1}{2}(R(\omega_0) - S(\omega_0))$$

The resulting Fourier series $P(\omega_0)$ and $N(\omega_0)$ represent the frequency domain positive and negative step responses, respectively.

The frequency domain positive and negative step responses can be converted into the time domain by utilizing an inverse Fourier transform. This generates the two curves p(t) and n(t). Alternatively, a low order pole/zero model can be found that matches the frequency samples of $P(\omega_0)$ and $N(\omega_0)$. This procedure is represented by the steps labeled 160 and 170 in FIG. 1. Similar to the interpolation steps described above, rational polynomials in the Laplace variable s are found that fit the known Fourier samples. In a preferred embodiment, we restrict the polynomials to low order so the resulting model has low computational overhead.

The resulting low order pole/zero models can be utilized in a time domain simulation of the system being analyzed. Note that since the step responses have been found, we are not restricted to the analysis of periodic inputs, and an arbitrary pulse train can be simulated. Alternatively, the impulse response of the system can be easily derived from the step responses. This impulse response can then be efficiently convolved with arbitrary input waveforms to efficiently predict the response of the system to such waveforms.

In an alternative embodiment, the rational polynomials found in the interpolation steps are added and subtracted to get rational polynomials that model the positive and negative step responses. This would effectively combine the two curve fitting steps into a single curve fitting followed by a combination of polynomials. The same sequence of steps illustrated in FIG. 1 is performed, and the combination steps 140 and 150 would be a combination of polynomials rather than a combination of Fourier samples. Steps 160 and 170 then become trivial since the result of the combination steps 140 and 150 would be pole/zero models. One characteristic of such an embodiment is that the order of the polynomials chosen in steps 120 and 130 would be the same as the order of the polynomials in the final model, unless changes were made in steps 160 and 170. This may be disadvantageous if it is desirable to have a higher order polynomial in the interpolation steps than in the final model.

Figure 4:
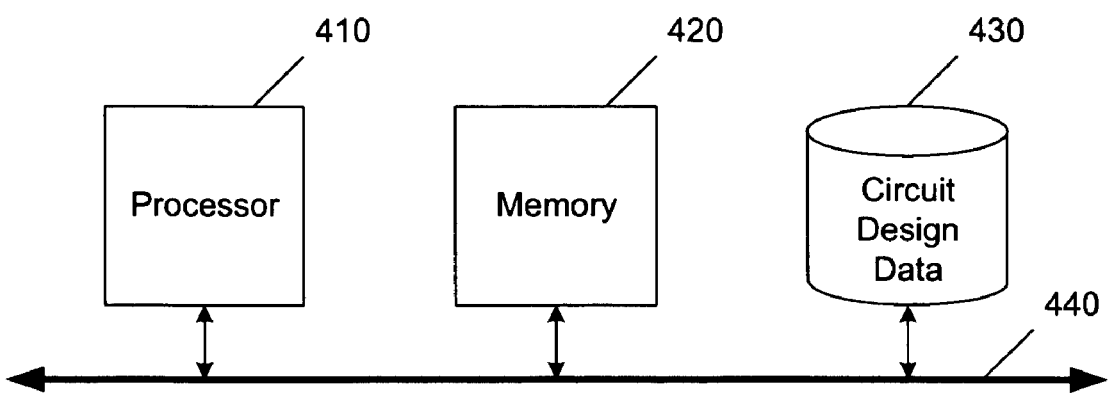
FIG. 4 illustrates a system incorporating an embodiment of the invention.

FIG. 4 illustrates a system incorporating an embodiment of the present invention. Processor 410 executes instructions and utilizes memory 420 to perform the steps described above. Storage element 430 stores circuit design data utilized by processor 410 to describe the circuit being modeled. Storage element 430 also stores the resulting model itself, after processor 410 has performed the steps described above. Alternatively, the model can be generated, stored in memory 420 and utilized immediately by processor 410 in a time domain simulation of the circuit. Processor 410, memory 420 and storage element 430 communicate through communication medium 440.

The technique described above is ideal for accurately modeling the output stage of a given circuit. In order to create a complete macromodel of a given circuit, this can be used in conjunction with an "ideal" or functional model of the circuit. FIG. 5a illustrates an application of an embodiment of the present invention to the modeling of a divide by two circuit. Such a circuit produces a signal on its output pin that is one half the frequency of the signal appearing on its input pin. In this example the divide by two circuit has been split into an ideal model, which is an idealized representation of the behavior of the circuit, and a "remainder model," which captures the non-idealities of the circuit. The remainder model can be created as a pole-zero model as described above.

FIGS. 5b, 5c and 5d illustrate waveforms corresponding to input, ideal output and actual output signals respectively. Ideal model 510 models the ideal divide ratio from input to output. Input signal 530 appearing on the input pin produces signal 540 on its output. Remainder model 520 is a pole-zero model that models the step response of the true circuit to the output of the ideal model. Signal 540 appearing on the input pin of remainder model 520 produces signal 550 as the output. By combining a function macromodel with the remainder model virtually any block can be modeled in the time domain. Note that if the remainder model is symmetric for positive and negative edges, it can be synthesized as a linear subnetwork.

In an alternative embodiment, several harmonic balance analyses of several relevant periods T could be performed. Then we could use all of the even harmonic samples in the interpolation of $R(\omega)$ and all of the odd harmonic samples in the interpolation of $S(\omega)$. This technique may improve the accuracy of $P(\omega)$ and $N(\omega)$.

In another alternative embodiment, we could begin analysis with a long period square wave as input to the harmonic balance analysis step. We could then double the frequency for a set of subsequent square wave analyses. When the harmonics at corresponding frequencies begin to differ by some criteria, we have reached the point where low to high transitions are affecting subsequent high to low transitions and vice versa. Such a sequence of analyses may be useful for determining what frequency to use to generate the positive and negative step responses, and may indicate the limits to where the accuracy of the positive and negative step responses breaks down.

Note that the above method can be applied to generate the response to an arbitrary shaped pulse train, not just a square wave. For example, if a periodic triangle wave is used as input to the harmonic balance analysis step, then it would be possible to separate out the positive-going and negative-going responses to such a waveform and then utilize these responses to simulate an arbitrary sequence of triangle shaped pulses.

Another application of the method described above is to a nonlinear circuit with a carrier signal that is modulated by a pulse train. That is, there are two inputs, a carrier input driven by a fixed frequency and a modulation input that is driven by an arbitrary waveform. In this case we can consider the carrier signal to be part of the system to be modeled, and as above we generate an approximation to the positive and negative going step response of the system.

To generate the model for such a system, we first perform two harmonic balance analyses, one with the modulation input low and one with the modulation input high. In both cases the carrier signal which is considered to be part of the model is enabled. We can represent the results of these two harmonic balance analyses as $L(\omega)$ and $H(\omega)$ respectively, in the frequency domain, and l(t) and h(t) in the time-domain.

Next we perform the steps described above, starting with a third harmonic balance analysis with both the carrier signal and the periodic pulse train turned on. In the time domain we postulate that we can represent the response to the positive pulse transition as:

$$p(t) \cdot [h(t) - l(t)]$$

and the response to the negative pulse transition by:

$$n(t)\cdot[l(t)-h(t)]$$

We can find these two overall functions in the frequency domain via the same technique employed in the earlier case. Knowing the frequency domain responses of these two functions as well as $H(\omega)$ and $L(\omega)$, we can extract the harmonics of $P(\omega)$ and $N(\omega)$ corresponding to p(t) and n(t) by "deconvolution."

Let $R(\omega)$ and $S(\omega)$ be the response of the system to the positive and negative going pulses respectively. Then, $$R(\omega)=F(p(t)\cdot[h(t)-l(t)])=P(\omega)*(H(\omega)-L(\omega))$$

$$S(\omega)=F(n(t)\cdot[l(t)-h(t)])=N(\omega)*(L(\omega)-H(\omega))$$

Since $R(\omega)$, $S(\omega)$, $H(\omega)$ and $L(\omega)$ are known, we can solve for $P(\omega)$ and $N(\omega)$ by de-convolving the functions on the left and right hand sides.

Next we solve for $P(\omega)$ and $N(\omega)$ in compact pole zero form. This then gives us the response of the system (including the carrier signal) to a positive and negaive input pulse.

One skilled in the art will appreciate that the present invention can be practiced by other than the described embodiments, which are presented for purpose of illustration and not of limitation.

The invention claimed is:

1. A method of generating a model of the response of a system to an arbitrary pulse train comprising the steps of:
   (a) generating a frequency domain response of said system to a periodic waveform;
   (b) interpolating odd frequency components of said frequency domain response;
   (c) interpolating even frequency components of said frequency domain response;
   (d) combining said interpolated odd frequency components with said interpolated even frequency components to generate a frequency domain positive step response;
   (e) combining said interpolated odd frequency components with said interpolated even frequency components to generate a frequency domain negative step response; and
   (f) producing a model of said system from said frequency domain positive step response and said frequency domain negative step response;
   wherein said model allows accurate and efficient time domain simulation of said system.

2. The method of claim 1, wherein said generating step (a) comprises performing a harmonic balance analysis of said system.

3. The method of claim 1, wherein said periodic waveform comprises a square wave.

4. The method of claim 1, wherein said interpolating odd frequency components step (b) comprises fitting a rational polynomial in the Laplace variable s to said odd frequency component and utilizing said rational polynomial to compute frequency domain samples.

5. The method of claim 1, wherein said interpolating even frequency components step (c) comprises fitting a rational polynomial in the Laplace variable s to said even frequency components and utilizing said rational polynomial to compute frequency domain samples.

6. The method of claim 1, wherein said producing step (f) comprises the step of generating a time domain positive step response from said frequency domain positive step response.

7. The method of claim 1, wherein said producing step (f) comprises the step of generating a time domain negative step response from said frequency domain negative step response.

8. The method of claim 1, wherein said producing step (f) comprises the step of generating an impulse response from said frequency domain positive step response and said frequency domain negative step response.

9. The method of claim 1, wherein said producing step (f) comprises the step of determining a low order pole/zero model for said frequency domain positive step response.

10. The method of claim 1, wherein said producing step (f) comprises the step of determining a low order pole/zero model for said frequency domain positive step response.

11. The method of claim 1, wherein said generating step (a) comprises:
    (a1) generating a plurality of frequency domain responses for a plurality of different frequencies of said periodic waveform, and
    (a2) combining a plurality of said plurality of frequency domain responses.

12. The method of claim 1, wherein said generating step (a) comprises:
    (a1) generating a plurality of frequency domain responses for a plurality of different frequencies of said periodic waveform, and
    (a2) combining a plurality of said plurality of frequency domain responses into a single frequency domain response.

13. The method of claim 1, wherein said system has a modulation input signal and a carrier input signal, further comprising the steps of:
    (g) generating a modulation low frequency domain response of said system with a periodic waveform at said carrier input signal and with said modulation input signal at a low state;
    (h) producing a modulation low model of said system from said modulation low frequency domain response;
    (i) generating a modulation high frequency domain response of said system with a periodic waveform at said carrier input signal and with said modulation input signal at a high state;
    (j) producing a modulation high model of said system from said modulation high frequency domain response; and
    wherein said steps (a) through (f) of generating, interpolating, combining and producing are performed to produce an overall model of said system to an arbitrary input on said modulation input signal and a periodic waveform on said carrier input signal.

14. A computer program product having executable instructions on a computer readable medium adapted to perform a method of generating a model of the response of a system to an arbitrary pulse train comprising the steps of:
    (a) generating a frequency domain response of said system to a periodic waveform;
    (b) interpolating odd frequency components of said frequency domain response;
    (c) interpolating even frequency components of said frequency domain response;
    (d) combining said interpolated odd frequency components with said interpolated even frequency components to generate a frequency domain positive step response;
    (e) combining said interpolated odd frequency components with said interpolated even frequency components to generate a frequency domain negative step response; and
    (f) producing a model of said system from said frequency domain positive step response and said frequency domain negative step response;
    wherein said model allows accurate and efficient time domain simulation of said system.

15. The computer program product of claim 14, wherein said generating step (a) comprises performing a harmonic balance analysis of said system.

16. The computer program product of claim 14, wherein said periodic waveform comprises a square wave.

17. The computer program product of claim 14, wherein said interpolating odd frequency components step (b) comprises fitting a rational polynomial in the Laplace variable s to said odd frequency component and utilizing said rational polynomial to compute frequency domain samples.

18. The computer program product of claim 14, wherein said interpolating even frequency components step (c) comprises fitting a rational polynomial in the Laplace variable s to said even frequency components and utilizing said rational polynomial to compute frequency domain samples.

19. The computer program product of claim 14, wherein said producing step (f) comprises the step of generating a time domain positive step response from said frequency domain positive step response.

20. The computer program product of claim 14, wherein said producing step (f) comprises the step of generating a time domain negative step response from said domain frequency domain negative step response.

21. The computer program product of claim 14, wherein said producing step (f) comprises the step of generating an impulse response from said frequency domain positive step response and said frequency domain negative step response.

22. The computer program product of claim 14, wherein said producing step (f) comprises the step of determining a low order pole/zero model for said frequency domain positive step response.

23. The computer program product of claim 14, wherein said producing step (f) comprises the step of determining a low order pole/zero model for said frequency domain negative step response.

24. The computer program product of claim 14, wherein said generating step (a) comprises;
 (a1) generating a plurality of frequency domain responses for a plurality of different frequencies of said periodic waveform, and
 (a2) selecting one of said plurality of frequency domain responses.

25. The computer program product of claim 14, wherein said generating step (a) comprises:
 (a1) generating a plurality of frequency domain responses for a plurality of different frequencies of said periodic waveform, and
 (a2) combining a plurality of said plurality of frequency domain responses into a single frequency domain response.

26. The computer program product of claim 14, wherein said system has a modulation input signal and a carrier input signal, further comprising the steps of:
 (g) generating a modulation low frequency domain response of said system with a periodic waveform at said carrier input signal and with said modulation input signal at a low state
 (h) producing a modulation low model of said system from said modulation low frequency domain response;
 (i) generating a modulation high frequency domain response of said system with a periodic waveform at said carrier input signal and with said modulation input signal at a high state;
 (j) producing a modulation high model of said system from said modulation high frequency domain response; and
 wherein said steps (a) through (f) of generating, interpolating, combining and producing are performed to produce an overall model of said system to an arbitrary input on said modulation input signal and a periodic waveform on said carrier input signal.

* * * * *

UNITED STATES PATENT AND TRADEMARK OFFICE
CERTIFICATE OF CORRECTION

PATENT NO. : 7,412,370 B2  
APPLICATION NO. : 11/007521  
DATED : August 12, 2008  
INVENTOR(S) : Trihy et al.

Page 1 of 1

It is certified that error appears in the above-identified patent and that said Letters Patent is hereby corrected as shown below:

On the Title page, Item (56), under "Other Publications", in column 1, line 1, delete "S.M. narayana" and insert -- S.M. Narayana --, therefor.

On the Title page, Item (56), under "Other Publications", in column 2, line 5, delete "Eduction." and insert -- Education. --, therefor.

In column 8, line 10, in Claim 10, delete "positive" and insert -- negative --, therefor.

In column 8, line 16, in Claim 11, delete "combining a plurality" and insert -- selecting one --, therefor.

In column 9, line 23, in Claim 20, after "said" delete "domain".

In column 10, line 2, in Claim 24, delete "comprises;" and insert -- comprises: --, therefor.

In column 10, line 22, in Claim 26, delete "state" and insert -- state; --, therefor.

Signed and Sealed this

Fourth Day of November, 2008

JON W. DUDAS  
*Director of the United States Patent and Trademark Office*